(12) United States Patent
Hassan et al.

(10) Patent No.: US 9,151,793 B1
(45) Date of Patent: Oct. 6, 2015

(54) METHOD FOR MEASURING THE COMPLEX DIELECTRIC CONSTANT OF A SUBSTANCE

(71) Applicants: Essam Eldin Mohamed Hassan, Alexandria (EG); Hassan Ali Ragheb, Cairo (EG)

(72) Inventors: Essam Eldin Mohamed Hassan, Alexandria (EG); Hassan Ali Ragheb, Cairo (EG)

(73) Assignee: KING FAHD UNIVERSITY OF PETROLEUM AND MINERALS, Dhahran (SA)

( * ) Notice: Subject to any disclaimer, the term of this patent is extended or adjusted under 35 U.S.C. 154(b) by 0 days.

(21) Appl. No.: 14/497,296

(22) Filed: Sep. 25, 2014

(51) Int. Cl.
*G01R 27/26* (2006.01)

(52) U.S. Cl.
CPC .................................. *G01R 27/2682* (2013.01)

(58) Field of Classification Search
CPC ............... G01N 22/00; G01R 27/2617; G01R 27/2652; G01R 27/2658; G01R 27/2664
See application file for complete search history.

(56) References Cited

U.S. PATENT DOCUMENTS 8,618,817 B2   12/2013   Jakoby et al.

FOREIGN PATENT DOCUMENTS

| CN | 1120165 A | 4/1996 |
|---|---|---|
| CN | 101545931 A | 9/2009 |
| CN | 202383208 U | 8/2012 |
| JP | 2001-281284 | 10/2001 |
| JP | 2002-214161 | 7/2002 |

OTHER PUBLICATIONS

Bois et al., Multimode Solution for the Reflection Properties of an Open-Ended Rectangular Waveguide Radiating into a Dielectric Half-Space: The Forward and Inverse Problems, Dec. 1999, IEEE Transactions on Instrumentation and Measurement, vol. 48, No. 6, pp. 1131-1140.*

Weir, William B. "Automatic Measurement of Complex Dielectric Constant and Permeability at Microwave Frequencies," Proceedings of the IEEE, vol. 62, No. 1, pp. 33-36, Jan. 1974.

* cited by examiner

*Primary Examiner* — Toan Le
(74) *Attorney, Agent, or Firm* — Richard C. Litman

(57) ABSTRACT

The method for measuring the complex dielectric constant of a substance is based on calculations made in the frequency domain. An open ended rectangular waveguide terminates, at one end, in a non-resonant rectangular cavity, which is then filled with a substance of interest. An electromagnetic wave of known frequency is transmitted through the waveguide and the reflection coefficient at the interface between the waveguide and the cavity is measured by a network analyzer or the like. Another measurement is then made with a slight variation in depth of the cavity or a variation in frequency, and from these two measurements of the reflection coefficient, the complex dielectric constant of the substance of interest can be calculated.

2 Claims, 2 Drawing Sheets

METHOD FOR MEASURING THE COMPLEX DIELECTRIC CONSTANT OF A SUBSTANCE

BACKGROUND OF THE INVENTION

1. Field of the Invention

The present invention relates generally to measurements of material properties, and particularly to an optical frequency-based method for measuring the complex dielectric constant of a substance.

2. Description of the Related Art

The measurement of the complex dielectric constant and complex permeability is required not only for scientific but also for industrial applications. For example, areas in which knowledge of the properties of materials at microwave frequencies is required include microwave heating, biological effects of microwaves, and nondestructive testing.

Although it is known to make measurements of the complex dielectric constant and complex permeability in the time domain, the calculations involved are complex and are dependent upon time and energy intensive Fourier transformations due to the measured transient response. Further, this technique typically only works within a severely limited band of frequencies, dependent upon the time response of the initial pulse and its repetition frequency. It would be desirable to be able to measure the complex dielectric constant directly in the frequency domain, allowing for measurements to be made over a wide range of frequencies, with calculations being relatively fast and simple.

Thus, a method for measuring the complex dielectric constant of a substance addressing the aforementioned problems is desired.

SUMMARY OF THE INVENTION

Embodiments of methods for measuring a complex dielectric constant of a substance are based on calculations made in the frequency domain. An open ended rectangular waveguide terminates, at one end, in a non-resonant rectangular cavity, which is then filled with a substance of interest. An electromagnetic wave of a known frequency is transmitted through the waveguide and a reflection coefficient at the interface between the waveguide and the cavity is measured by a network analyzer or the like. Another measurement is then made with a slight variation in depth of the cavity or a variation in frequency, and from these two measurements of the reflection coefficient, the complex dielectric constant of the substance of interest can be calculated. The method for measuring the complex dielectric constant of a substance is performed as follows:

(a) providing an open ended rectangular waveguide having a cross-sectional width a and a cross-sectional height b;

(b) providing a non-resonant rectangular cavity in communication with one of the ends of the open ended rectangular waveguide, the non-resonant rectangular cavity having a cross-sectional width g, a cross-sectional height h and a cross-sectional length d, the non-resonant rectangular cavity being symmetrically fed an electromagnetic wave by the open ended rectangular waveguide;

(c) filling the non-resonant rectangular cavity with a substance of interest, and it should be understood that the substance can be in powdered, liquid or solid form, and the cavity is filled without bubbles or gaps in the filled cavity;

(d) transmitting an electromagnetic wave through the open ended rectangular waveguide toward the non-resonant rectangular cavity, and desirably, only the dominant mode of the electromagnetic wave is allowed to propagate, and the source of the wave should be about $10\lambda$ from the open end of the waveguide, where $\lambda$ is the wavelength of the electromagnetic wave;

(e) measuring a first reflection coefficient $R_1$ at an interface between the open ended rectangular waveguide and the non-resonant rectangular cavity, and the magnitude and phase of the reflection coefficient can be measured by a conventional network analyzer or the like, and the measurement location is desirably a distance of at least $10\lambda$, from the interface;

(f) varying the cross-sectional length d of the non-resonant rectangular cavity by a length $\delta$ and, as an alternative to varying the cross-sectional length, the frequency of the electromagnetic wave can be varied;

(g) re-transmitting the electromagnetic wave through the open ended rectangular waveguide toward the non-resonant rectangular cavity;

(h) measuring a second reflection coefficient $R_2$ at the interface between the open ended rectangular waveguide and the non-resonant rectangular cavity;

(i) calculating a first variable LL as $$LL = \sum_{m=1}\sum_{n=1} B_{mn}\left(\frac{n\pi}{b}\right)I_{yg}(m,n) - \frac{1}{j\omega\mu_o}\sum_{m=1}\sum_{n=1} A_{mn}\gamma_{mn}\left(\frac{m\pi}{a}\right)I_{yg}(m,n) - \frac{1}{j\omega\mu_o}\sum_{m=2} A_{m0}\gamma_{mo}\left(\frac{m\pi}{a}\right)I_{yg}(m,o),$$

where m and n are summation indices ranging between 1 and N, where N is an integer selected for stabilization of the summations, $$A_{mn} = \frac{-m\pi/a}{k_{mn}^2}\left(\frac{4}{ab}\right)I_{yg}(m,n),$$

where $$k_{mn} = \sqrt{\left(\frac{m\pi}{a}\right)^2 + \left(\frac{n\pi}{b}\right)^2}$$

and $$I_{yg}(m,n) = \int_{x=0}^{a}\int_{y=0}^{b} f_y(x,y)\sin\left(\frac{m\pi x}{a}\right)\cos\left(\frac{n\pi y}{b}\right)dx\,dy,$$

where $$f_y(x,y) = \frac{\sin\left(\frac{\pi}{a}x\right)}{\sqrt{1-\left(\frac{y-\frac{b}{2}}{\frac{b}{2}}\right)^2}},$$

x and y being Cartesian coordinates corresponding to width and height, respectively, $$B_{mn} = -\left(\frac{\frac{n\pi}{b}}{\frac{m\pi}{a}}\right)\left(\frac{j\omega\epsilon_o}{\gamma_{mn}}\right)A_{mn},$$

where j is the imaginary number, ω is an angular frequency of the electromagnetic wave, $\in_o$ is the constant permittivity of free space, and $$\gamma_{mn} = \sqrt{k_{mn}^2 - k_o^2},$$

where $$k_0 = \omega\sqrt{\mu_0 \epsilon_0},$$

where $\mu_0$ the constant magnetic permeability of free space, wherein $$A_{m0} = \frac{-2}{m\pi/a}\left(\frac{1}{ab}\right)I_{yg}(m, 0) \text{ for } m \neq 1;$$

(j) establishing a first set of estimated values for a real part of a dielectric constant associated with the substance of interest, $\in_i$, where i ranges between 1 and a pre-selected integer S;

(k) calculating a second variable $M_i$ for i ranging between 1 and S as $$M_i = \sum_{p=1}\sum_{q=1} C_{pq}\left(\frac{q\pi}{h}\right)\cos(\alpha_{pq}d)I_{yc}(p, q) +$$

$$\frac{1}{j\omega\mu_o}\sum_{p=1}\sum_{q=1} D_{pq}\alpha_{pq}\left(\frac{p\pi}{g}\right)\cos(\alpha_{pq}d)I_{yc}(p, q) +$$

$$\frac{1}{j\omega\mu_o}\sum_{p=1} D_{p0}\alpha_{po}\left(\frac{p\pi}{g}\right)\cos(\alpha_{p0}d)I_{yc}(p, o),$$

where p and q are summation indices ranging between 1 and N, $$D_{pq} = \frac{-p\pi/g}{k_{pq}^2\sin(\alpha_{pq}d)}\left(\frac{4}{gh}\right)I_{yc}(p, q),$$

where $$k_{pq} = \sqrt{\left(\frac{p\pi}{g}\right)^2 + \left(\frac{q\pi}{h}\right)^2}$$

and $$\alpha_{pq} = \sqrt{k_i^2 - k_{pq}^2},$$

where $$k_i = \omega\sqrt{\mu_o\epsilon_o\epsilon_i},$$

and $$C_{pq} = -\left(\frac{\frac{q\pi}{h}}{\frac{p\pi}{g}}\right)\left(\frac{(j\omega\epsilon_o\epsilon_i + \delta)}{\alpha_{pq}}\right)D_{pq},$$

where $$I_{yc}(p, q) = \int_{x=0}^{a}\int_{y=0}^{b} f_y(x, y)\sin\left(\frac{p\pi x}{g}\right)\cos\left(\frac{q\pi y}{h}\right)dx\,dy \text{ and}$$

$$D_{p0} = \frac{-1}{\frac{p\pi}{g}\sin(\alpha_{p0}d)}\left(\frac{2}{gh}\right)I_{yc}(p, 0);$$

(l) establishing a first set of values of $\in_i$ corresponding to the calculated second variable $M_i$ which satisfy the condition $$\frac{1 - R_1}{1 + R_1} = \frac{(LL - M_i)(ab)j\omega\mu_o}{2I_{yg}^2(1, 0)\gamma_{10}};$$

(m) establishing a second set of values of $\in_i$ corresponding to the calculated second variable $M_i$ which satisfy the condition $$\frac{1 - R_2}{1 + R_2} = \frac{(LL - M_i)(ab)j\omega\mu_o}{2I_{yg}^2(1, 0)\gamma_{10}};$$

(n) selecting a value of $\in_i$ which is a member of both the first set and the second set of values corresponding to the calculated second variable $M_i$ and setting this selected value equal to a variable $\in_d$;

(o) establishing a second set of estimated values for the real part of a dielectric constant associated with the substance of interest, $\in_{ri}$, where i ranges between 1 and S, such that $\in_{ri} = \in_i - j\in'$, where $\in'$ is an imaginary part of the dielectric constant associated with the substance of interest, where $\in_{r1} = \in_d - x_1$ and $\in_{rS} = \in_d + x_1$ and $\in' = x_2$, where $x_1$ is approximately equal to 0.5 and $x_2$ is a pre-selected value based on expected conductivity of the substance of interest;

(p) re-calculating the second variable $M_i$ for i ranging between 1 and S as $M_i =$ $$\sum_{p=1}\sum_{q=1} C_{pq}\left(\frac{q\pi}{h}\right)\cos(\alpha_{pq}d)I_{yc}(p, q) +$$

$$\frac{1}{j\omega\mu_o}\sum_{p=1}\sum_{q=1} D_{pq}\alpha_{pq}\left(\frac{p\pi}{g}\right)\cos(\alpha_{pq}d)I_{yc}(p, q) +$$

$$\frac{1}{j\omega\mu_o}\sum_{p=1} D_{p0}\alpha_{po}\left(\frac{p\pi}{g}\right)\cos(\alpha_{p0}d)I_{yc}(p, o),$$

where $k_i = \omega\sqrt{\mu_0\epsilon_0(\epsilon_{ri} - \epsilon')}$ and $C_{pq} = -\left(\frac{\frac{q\pi}{h}}{\frac{p\pi}{g}}\right)\left(\frac{(j\omega\epsilon_o\epsilon_{ri} + \delta)}{\alpha_{pq}}\right)D_{pq};$ (q) establishing a first set of values of $\in_{ri}$ corresponding to the re-calculated second variable $M_i$ which satisfy the condition $$\frac{1-R_1}{1+R_1} = \frac{(LL-M_i)(ab)j\omega\mu_o}{2I_{yg}^2(1,0)\gamma_{10}};$$

(r) establishing a second set of values of $\in_{ri}$ corresponding to the re-calculated second variable $M_i$ which satisfy the condition $$\frac{1-R_2}{1+R_2} = \frac{(LL-M_i)(ab)j\omega\mu_o}{2I_{yg}^2(1,0)\gamma_{10}};$$

(s) selecting a value of $\in_{ri}$ which is a member of both the first set and the second set of values corresponding to the re-calculated second variable $M_i$ and setting the selected value equal to a variable $\in_{rd}$; and (t) re-calculating the imaginary part of the dielectric constant associated with the substance of interest, $\in'$, as $\in'=j(\in_{rd}-\in_d)$, wherein the dielectric constant associated with the substance of interest is determined as $\in_{rd}+j(\in_{rd}-\in_d)$.

These and other features of the present invention will become readily apparent upon further review of the following specification.

BRIEF DESCRIPTION OF THE DRAWINGS

Unless otherwise indicated, similar reference characters denote corresponding features consistently throughout the attached drawings.

DETAILED DESCRIPTION OF THE PREFERRED EMBODIMENTS

Figure 1:
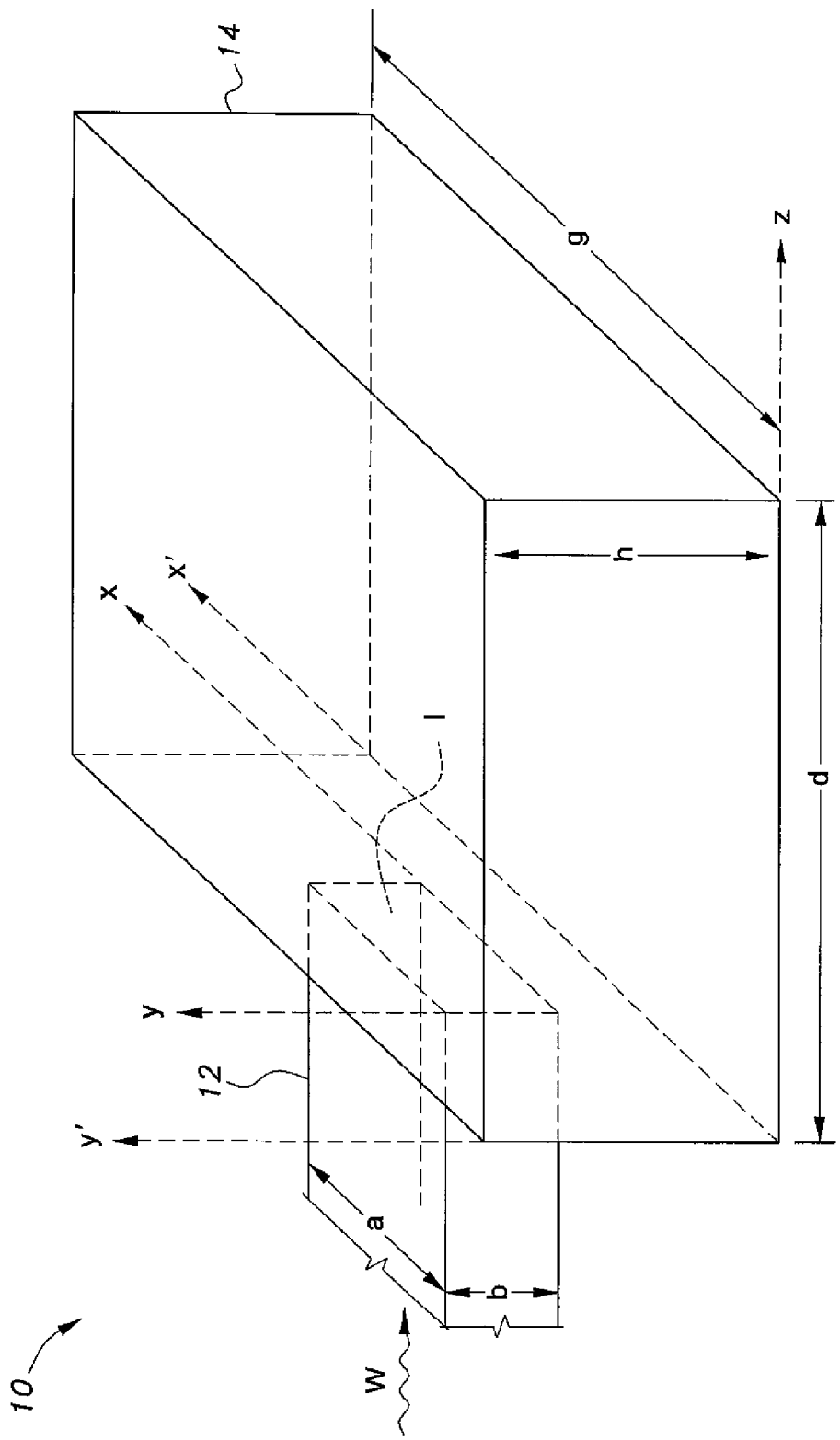
FIG. 1 diagrammatically illustrates an optical configuration for performing the method for measuring the complex dielectric constant of a substance according to the present invention.

Embodiments of methods for measuring the complex dielectric constant of a substance are based on calculations made in the frequency domain. As shown in the overall configuration 10 of FIG. 1, an open ended rectangular waveguide 12 terminates, at one end, in a non-resonant rectangular cavity 14, which is then filled with a substance of interest. An electromagnetic wave W of known frequency, such as generated by an electromagnetic wave generator 122, as can be a suitable conventional electromagnetic wave generator, is transmitted through the waveguide 12 and the reflection coefficient at the interface I between the waveguide 12 and the cavity 14 is measured by a network analyzer 120, such as a conventional network analyzer or the like, for example. Another measurement is then made with a slight variation in depth of the cavity or a variation in frequency and, from these two measurements of the reflection coefficient, the complex dielectric constant of the substance of interest can be calculated.

An embodiment of a method for measuring the complex dielectric constant of a substance includes performing the following steps of operations. The open ended rectangular waveguide 12 is provided for the dielectric constant measurement, the open ended rectangular waveguide 12 having a cross-sectional width a and a cross-sectional height b. Also, the non-resonant rectangular cavity 14 is provided in communication with one of the ends of the open ended rectangular waveguide 12, the non-resonant rectangular cavity 14 having a cross-sectional width g, a cross-sectional height h and a cross-sectional length d, the non-resonant rectangular cavity 14 being symmetrically fed an electromagnetic wave by the open ended rectangular waveguide 12.

Then, the non-resonant rectangular cavity 14 is filled with a substance of interest. It should be understood that the substance of interest can be in powdered, liquid or solid form, but the non-resonant rectangular cavity 14 is filled without bubbles or gaps in the filled non-resonant rectangular cavity 14. An electromagnetic wave W is transmitted through the open ended rectangular waveguide 12 toward the non-resonant rectangular cavity 14. Desirably, only the dominant mode of the electromagnetic wave W is allowed to propagate. The source of the wave W should be about $10\lambda$ from the open end of the waveguide, where $\lambda$ is the wavelength of the electromagnetic wave W, such as can be in meters, and the wave W can be generated by a suitable wave generator, such as the electromagnetic wave generator 122, for example.

Then a first reflection coefficient $R_1$ is measured at the interface I between the open ended rectangular waveguide 12 and the non-resonant rectangular cavity 14. The magnitude and phase of the reflection coefficient can be measured by the network analyzer 120, such as a conventional network analyzer, such as a Vector Network Analyzer (VNA) or a network analyzer using a standard Null Shift and a VSWA technique, or the like, for example, and the measurement location is desirably a distance of at least $10\lambda$ from the interface I. The cross-sectional length d of the non-resonant rectangular cavity 14 is varied by a length $\delta$. As an alternative to varying the cross-sectional length, the frequency of electromagnetic wave W can be varied for the measurement, for example. The electromagnetic wave W is re-transmitted through the open ended rectangular waveguide 12 toward the non-resonant rectangular cavity 14 and a second reflection coefficient $R_2$ is measured by the network analyzer 120 at the interface I between the open ended rectangular waveguide 12 and the non-resonant rectangular cavity 14.

Then there is calculated, such as by system 100, a first variable LL as $$LL = \sum_{m=1}^{\infty}\sum_{n=1}^{\infty} B_{mn}\left(\frac{n\pi}{b}\right)I_{yg}(m,n) - \frac{1}{j\omega\mu_o}\sum_{m=1}^{\infty}\sum_{n=1}^{\infty} A_{mn}\gamma_{mn}\left(\frac{m\pi}{a}\right)I_{yg}(m,n) - \frac{1}{j\omega\mu_o}\sum_{m=2}^{\infty} A_{m0}\gamma_{mo}\left(\frac{m\pi}{a}\right)I_{yg}(m,o),$$

where m and n are summation indices ranging between 1 and N, where N is an integer selected for stabilization of the summations, $$A_{mn} = \frac{-m\pi/a}{k_{mn}^2}\left(\frac{4}{ab}\right)I_{yg}(m,n),$$

where $$k_{mn} = \sqrt{\left(\frac{m\pi}{a}\right)^2 + \left(\frac{n\pi}{b}\right)^2}$$

and $$I_{yg}(m, n) = \int_{x=0}^{a}\int_{y=0}^{b} f_y(x, y)\sin\left(\frac{m\pi x}{a}\right)\cos\left(\frac{n\pi y}{b}\right)dx\,dy,$$

where $f_y(x, y) = \dfrac{\sin\left(\dfrac{\pi}{a}x\right)}{\sqrt{1-\left(\dfrac{y-\dfrac{b}{2}}{\dfrac{b}{2}}\right)^2}},$ x and y being Cartesian coordinates corresponding to width and height, respectively, $$B_{mn} = -\left(\dfrac{\dfrac{n\pi}{b}}{\dfrac{m\pi}{a}}\right)\left(\dfrac{j\omega\epsilon_o}{\gamma_{mn}}\right)A_{mn},$$

where j is the imaginary number, ω is an angular frequency of the electromagnetic wave, $\in_o$ is the constant permittivity of free space, and $$\gamma_{mn} = \sqrt{k_{mn}^2 - k_o^2},$$

where $$k_0 = \omega\sqrt{\mu_0\epsilon_o},$$

where $\mu_0$ is the constant magnetic permeability of free space, typically equal to $4\pi\times10^7$, wherein $$A_{m0} = \dfrac{-2}{m\pi/a}\left(\dfrac{1}{ab}\right)I_{yg}(m, 0) \text{ for } m \neq 1.$$

It should be understood that N is suitably large to ensure stabilization of the summations, for example.

Then, a first set of estimated values is established for a real part of a dielectric constant associated with the substance of interest, $\in_i$, where i ranges between 1 and a pre-selected integer S. A second variable $M_i$ is then calculated, such as by the system 100, for i ranging between 1 and S as $$M_i = \sum_{p=1}\sum_{q=1} C_{pq}\left(\dfrac{q\pi}{h}\right)\cos(\alpha_{pq}d)I_{yc}(p, q) +$$
$$\dfrac{1}{j\omega\mu_o}\sum_{p=1}\sum_{q=1} D_{pq}\alpha_{pq}\left(\dfrac{p\pi}{g}\right)\cos(\alpha_{pq}d)I_{yc}(p, q) +$$
$$\dfrac{1}{j\omega\mu_o}\sum_{p=1} D_{p0}\alpha_{p0}\left(\dfrac{p\pi}{g}\right)\cos(\alpha_{p0}d)I_{yc}(p, o),$$

where p and q are summation indices ranging between 1 and N, $$D_{pq} = \dfrac{-p\pi/g}{k_{pq}^2\sin(\alpha_{pq}d)}\left(\dfrac{4}{gh}\right)I_{yc}(p, q),$$

where $$k_{pq} = \sqrt{\left(\dfrac{p\pi}{g}\right)^2 + \left(\dfrac{q\pi}{h}\right)^2}$$

and $$\alpha_{pq} = \sqrt{k_i^2 - k_{pq}^2},$$

where $$k_i = \omega\sqrt{\mu_0\epsilon_o\varepsilon_i},$$

and $$C_{pq} = -\left(\dfrac{\dfrac{q\pi}{h}}{\dfrac{p\pi}{g}}\right)\left(\dfrac{(j\omega\varepsilon_o\varepsilon_i + \delta)}{\alpha_{pq}}\right)D_{pq},$$

where $$I_{yc}(p, q) = \int_{x=0}^{a}\int_{y=0}^{b} f_y(x, y)\sin\left(\dfrac{p\pi x}{g}\right)\cos\left(\dfrac{q\pi y}{h}\right)dx\,dy \text{ and}$$

$$D_{p0} = \dfrac{-1}{\dfrac{p\pi}{g}\sin(\alpha_{p0}d)}\left(\dfrac{2}{gh}\right)I_{yc}(p, 0).$$

As noted above, N is suitably large to ensure stabilization of the summations.

Based upon the above calculations, the measurement of the first reflection coefficient $R_1$ and the measurement of the second reflection coefficient $R_2$, a first set of values of $\in_i$ corresponding to the calculated second variable $M_i$ is established which satisfy the condition $$\dfrac{1 - R_1}{1 + R_1} = \dfrac{(LL - M_i)(ab)j\omega\mu_o}{2I_{yg}^2(1, 0)\gamma_{10}}$$

and a second set of values of $\in_i$ corresponding to the calculated second variable $M_i$ is established which satisfy the condition $$\dfrac{1 - R_2}{1 + R_2} = \dfrac{(LL - M_i)(ab)j\omega\mu_o}{2I_{yg}^2(1, 0)\gamma_{10}}.$$

It should be understood that more than one value of $\in_i$ can be found which satisfies this equation, thus the first and second sets can have multiple members, for example.

Then a value of $\in_i$ is selected which is a member of both the first set and the second set of values corresponding to the calculated second variable $M_i$ and this selected value is set equal to a variable $\in_d$. Based on the selected value equal to the variable $\in_d$, a second set of estimated values is established for the real part of a dielectric constant associated with the substance of interest, $\in_{ri}$, where i ranges between 1 and S, such that $\in_{ri}=\in_r-j\in'$, where $\in'$ is an imaginary part of the dielectric constant associated with the substance of interest, where $\in_{r1}=\in_d-x_1$ and $\in_{rS}=\in_d+x_1$ and $\in'=x_2$, where $x_1$ is approximately equal to 0.5 and $x_2$ is a pre-selected value based on expected conductivity of the substance of interest. The variable $x_2$ ranges between zero and a suitable value dependent on the expected conductivity of the substance, for example. Any value can be assumed for $x_2$, and if no solution can be found, this value for $x_2$ can be increased.

Then, using the second set of estimated values that are based on the selected value equal to the variable $\in_d$, the second variable $M_i$ is re-calculated for i ranging between 1 and S as $$M_i = \sum_{p=1}\sum_{q=1} C_{pq}\left(\frac{q\pi}{h}\right)\cos(\alpha_{pq}d)I_{yc}(p,q) +$$

$$\frac{1}{j\omega\mu_o}\sum_{p=1}\sum_{q=1} D_{pq}\alpha_{pq}\left(\frac{p\pi}{g}\right)\cos(\alpha_{pq}d)I_{yc}(p,q) +$$

$$\frac{1}{j\omega\mu_o}\sum_{p=1} D_{p0}\alpha_{po}\left(\frac{p\pi}{g}\right)\cos(\alpha_{p0}d)I_{yc}(p,o),$$

where $k_i = \omega\sqrt{\mu_0\epsilon_o(\varepsilon_{ri}-\varepsilon')}$ and $$C_{pq} = -\left(\frac{\frac{q\pi}{h}}{\frac{p\pi}{g}}\right)\left(\frac{(j\omega\varepsilon_o\varepsilon_{ri}+\delta)}{\alpha_{pq}}\right)D_{pq}.$$

Using the re-calculated second variable $M_i$, a first set of values of $\in_{ri}$ corresponding to the re-calculated second variable $M_i$ is established which satisfy the condition $$\frac{1-R_1}{1+R_1} = \frac{(LL-M_i)(ab)j\omega\mu_o}{2I_{yg}^2(1,0)\gamma_{10}}$$

and a second set of values of $\in_{ri}$ corresponding to the re-calculated second variable $M_i$ is established which satisfy the condition $$\frac{1-R_2}{1+R_2} = \frac{(LL-M_i)(ab)j\omega\mu_o}{2I_{yg}^2(1,0)\gamma_{10}}.$$

Then a value of $\in_{ri}$ is selected, such as by the system 100, which is a member of both the first set and the second set of values corresponding to the re-calculated second variable $M_i$, and the selected value is set equal to a variable $\in_{rd}$. The imaginary part of the dielectric constant associated with the substance of interest, $\in'$, is re-calculated, such as by the system 100, as $\in'=j(\in_{rd}-\in_d)$, and the dielectric constant associated with the substance of interest is determined, such as by the system 100, as $\in_{rd}+j(\in_{rd}-\in_d)$.

Figure 2:
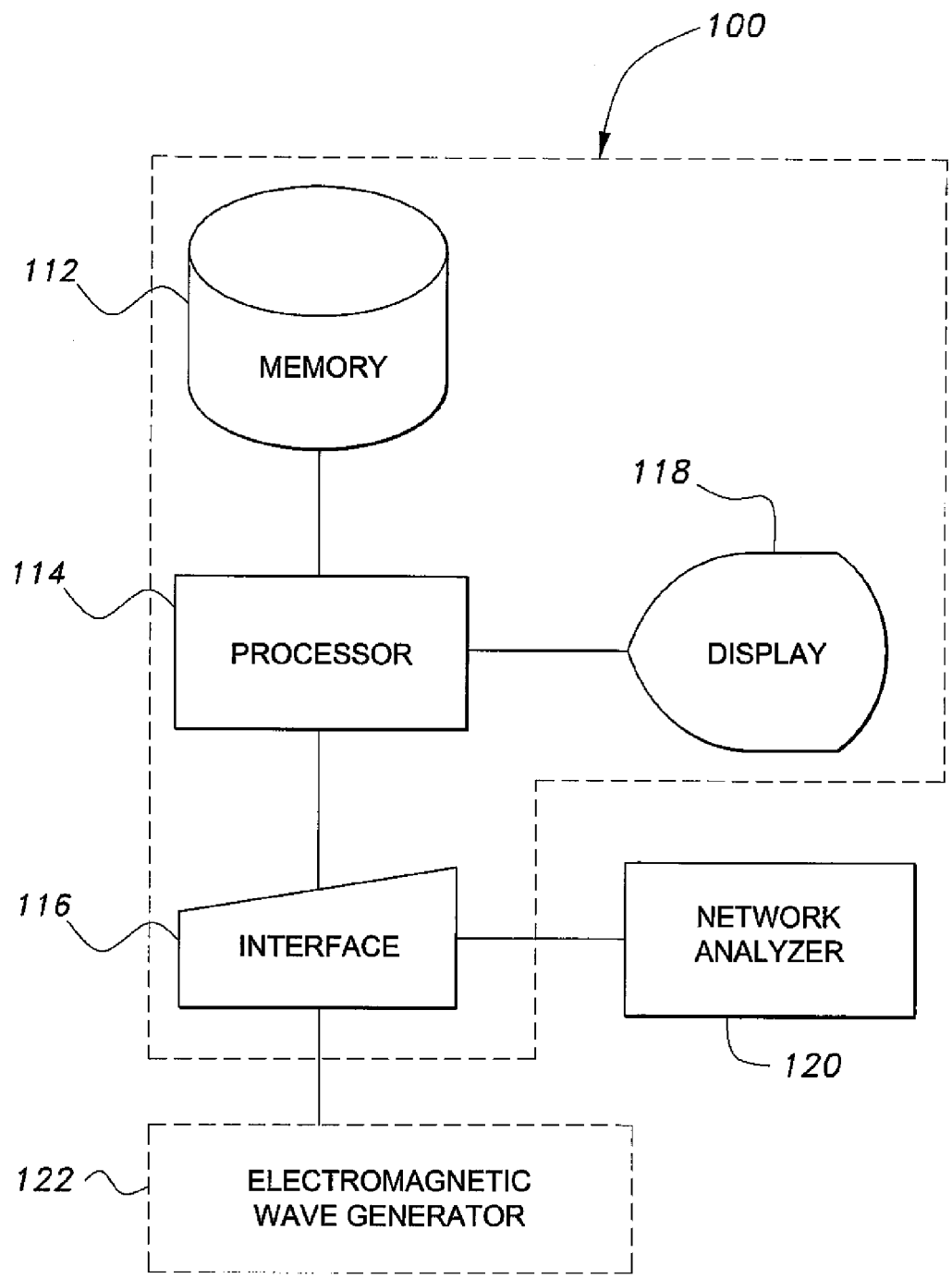
FIG. 2 is a block diagram illustrating system components of a system for performing calculations associated with the method for measuring the complex dielectric constant of a substance, and an associated network analyzer and electromagnetic wave generator, according to the present invention.

An apparatus to measure the complex dielectric constant of a substance of interest is also provided, such as illustrated in FIGS. 1 and 2, for example. The apparatus, generally illustrated by the configuration 10 of FIG. 1 and the system 100 of FIG. 2, includes the open ended rectangular waveguide 12, the non-resonant rectangular cavity 14 and the system 100. The system 100 of the apparatus includes a processor 114 and a memory 112, the processor 114 executing instructions of a program stored in the memory 112 to implement the determination of the complex dielectric constant, as described above, transforming the above described data and measurement information by implementing the above described algorithms, instructions, operations, and process steps to provide the determined complex dielectric constant of the substance of interest.

The apparatus can also have an associated electromagnetic wave generator, such as the electromagnetic wave generator 122, to generate and transmit the electromagnetic wave W through the open ended rectangular waveguide 12 toward the non-resonant rectangular cavity 14. Also, the apparatus can have associated suitable detectors, such as the network analyzer 120, or the like, to detect and measure the first reflection coefficient $R_1$ of the transmitted electromagnetic wave W measured at the interface I between the open ended rectangular waveguide 12 and the non-resonant rectangular cavity 14 and to detect and measure the second reflection coefficient $R_2$ measured at the interface I between the open ended rectangular waveguide and the non-resonant rectangular cavity 14 and to provide data and measurement information thereon to the system 100.

Further, the non-resonant rectangular cavity 14 can have an adjustable and variable cross-sectional length d so as to be adjustable to have a first cross-sectional length d and a second cross-sectional length d different from the first cross-sectional length d. Such adjustment of the cross-sectional length d can be provided by suitable adjustment members and/or associated with adjustable sides in the non-resonant rectangular cavity 14, to vary the dimensions or dimensional size of the non-resonant rectangular cavity 14, for example, In the above, the measurement equipment or apparatus typically required is a computer-controlled network analyzer for measuring the reflection coefficient. It should be understood that any suitable type of network analyzer or similar system can be used, as described. It should be further understood that the calculations for the determination of the dielectric constant can be performed by any suitable computer system, such as the system 100 that is diagrammatically shown in FIG. 2. Data for determining of the complex dielectric constant and programs or instructions for implementing the measurements and calculations for determination of the complex dielectric constant are entered into the system 100 via any suitable type of interface 116, and can be stored in the memory 112, which can be any suitable type of computer readable and programmable memory and is desirably a non-transitory, computer readable storage medium. Calculations are performed by the processor 114, which can be any suitable type of computer processor and can be displayed to the user on a display 118, which can be any suitable type of computer display.

The processor 114 can be associated with, or incorporated into, any suitable type of computing device, for example, a personal computer or a programmable logic controller (PLC) or an application specific integrated circuit (ASIC). The display 118, the processor 114, the memory 112 and any associated computer readable recording media are in communication with one another by any suitable type of data bus, as is well known in the art.

Examples of computer-readable recording media include non-transitory storage media, a magnetic recording apparatus, an optical disk, a magneto-optical disk, and/or a semiconductor memory (for example, RAM, ROM, etc.).

Examples of magnetic recording apparatus that can be used in addition to the memory 112, or in place of the memory 112, include a hard disk device (HDD), a flexible disk (FD), and a magnetic tape (MT). Examples of the optical disk include a DVD (Digital Versatile Disc), a DVD-RAM, a CD-ROM (Compact Disc-Read Only Memory), and a CD-R (Recordable)/RW. It should be understood that non-transitory computer-readable storage media include all computer-readable media, with the sole exception being a transitory, propagating signal.

It is to be understood that the present invention is not limited to the embodiments described above, but encompasses any and all embodiments within the scope of the following claims.

We claim:

1. A method for measuring a complex dielectric constant of a substance, comprising the steps of:
   (a) providing an open ended rectangular waveguide having a cross-sectional width a and a cross-sectional height b;
   (b) providing a non-resonant rectangular cavity in communication with one of the ends of the open ended rectangular waveguide, said non-resonant rectangular cavity having a cross-sectional width g, a cross-sectional height h and a cross-sectional length d, said non-resonant rectangular cavity being symmetrically fed by an electromagnetic wave by the open ended rectangular waveguide;
   (c) filling the non-resonant rectangular cavity with a substance of interest;
   (d) transmitting an electromagnetic wave generated by an electromagnetic wave generator through the open ended rectangular waveguide toward the non-resonant rectangular cavity;
   (e) measuring a first reflection coefficient $R_1$ at an interface between the open ended rectangular waveguide and the non-resonant rectangular cavity with a network analyzer;
   (f) varying the cross-sectional length d of the non-resonant rectangular cavity by a length $\in$;
   (g) re-transmitting the electromagnetic wave through the open ended rectangular waveguide toward the non-resonant rectangular cavity;
   (h) measuring a second reflection coefficient $R_2$ at the interface between the open ended rectangular waveguide and the non-resonant rectangular cavity with the network analyzer;
   (i) calculating a first variable LL as $$LL = \sum_{m=1}\sum_{n=1} B_{mn}\left(\frac{n\pi}{b}\right)I_{yg}(m,n) - \frac{1}{j\omega\mu_o}\sum_{m=1}\sum_{n=1} A_{mn}\gamma_{mn}\left(\frac{m\pi}{a}\right)I_{yg}(m,n) - \frac{1}{j\omega\mu_o}\sum_{m=2} A_{m0}\gamma_{mo}\left(\frac{m\pi}{a}\right)I_{yg}(m,o),$$

where m and n are summation indices ranging between 1 and N, where N is an integer selected for stabilization of the summations, $$A_{mn} = \frac{-m\pi/a}{k_{mn}^2}\left(\frac{4}{ab}\right)I_{yg}(m,n),$$

where $$k_{mn} = \sqrt{\left(\frac{m\pi}{a}\right)^2 + \left(\frac{n\pi}{b}\right)^2}$$

and $$I_{yg}(m,n) = \int_{x=0}^{a}\int_{y=0}^{b} f_y(x,y)\sin\left(\frac{m\pi x}{a}\right)\cos\left(\frac{n\pi y}{b}\right)dx\,dy,$$

where $$f_y(x,y) = \frac{\sin\left(\frac{\pi}{a}x\right)}{\sqrt{1-\left(\frac{y-\frac{b}{2}}{\frac{b}{2}}\right)^2}},$$

x and y being Cartesian coordinates corresponding to width and height, respectively, $$B_{mn} = -\left(\frac{\frac{n\pi}{b}}{\frac{m\pi}{a}}\right)\left(\frac{j\omega\epsilon_o}{\gamma_{mn}}\right)A_{mn},$$

where j is the imaginary number, $\omega$ is an angular frequency of the electromagnetic wave, $\in_o$ is the constant permittivity of free space, and $$\gamma_{mn} = \sqrt{k_{mn}^2 - k_o^2},$$

where $$k_0 = \omega\sqrt{\mu_o\epsilon_o},$$

where $\mu_0$ is the constant magnetic permeability of free space, wherein $$A_{m0} = \frac{-2}{m\pi/a}\left(\frac{1}{ab}\right)I_{yg}(m,0)$$

for m≠1;
   (j) establishing a first set of estimated values for a real part of a dielectric constant associated with the substance of interest, $\in_i$, where i ranges between 1 and a pre-selected integer S;
   (k) calculating a second variable $M_i$ for i ranging between 1 and S as $$M_i = \sum_{p=1}\sum_{q=1} C_{pq}\left(\frac{q\pi}{h}\right)\cos(\alpha_{pq}d)I_{yc}(p,q) + \frac{1}{j\omega\mu_o}\sum_{p=1}\sum_{q=1} D_{pq}\alpha_{pq}\left(\frac{p\pi}{g}\right)\cos(\alpha_{pq}d)I_{yc}(p,q) + \frac{1}{j\omega\mu_o}\sum_{p=1} D_{p0}\alpha_{po}\left(\frac{p\pi}{g}\right)\cos(\alpha_{p0}d)I_{yc}(p,o),$$

where p and q are summation indices ranging between 1 and N, $$D_{pq} = \frac{-p\pi/g}{k_{pq}^2 \sin(\alpha_{pq}d)}\left(\frac{4}{gh}\right)I_{yc}(p,q),$$

where $$k_{pq} = \sqrt{\left(\frac{p\pi}{g}\right)^2 + \left(\frac{q\pi}{h}\right)^2}$$

and $$\alpha_{pq} = \sqrt{k_i^2 - k_{pq}^2},$$

where $$k_i = \omega\sqrt{\mu_0 \epsilon_o \varepsilon_i},$$

and $$C_{pq} = -\left(\frac{\frac{q\pi}{h}}{\frac{p\pi}{g}}\right)\left(\frac{(j\omega_o\varepsilon_i + \delta)}{\alpha_{pq}}\right)D_{pq},$$

where $$I_{yc}(p,q) = \int_{x=0}^{a}\int_{y=0}^{b} f_y(x,y)\sin\left(\frac{p\pi x}{g}\right)\cos\left(\frac{q\pi y}{h}\right)dx\,dy$$

and $$D_{p0} = \frac{-1}{\frac{p\pi}{g}\sin(\alpha_{p0}d)}\left(\frac{2}{gh}\right)I_{yc}(p,0);$$

(l) establishing a first set of values of $\epsilon_i$ corresponding to the calculated second variable $M_i$ which satisfy the condition $$\frac{1-R_1}{1+R_1} = \frac{(LL - M_i)(ab)j\omega\mu_o}{2I_{yg}^2(1,0)\gamma_{10}};$$

(m) establishing a second set of values of $\epsilon_i$ corresponding to the calculated second variable $M_i$ which satisfy the condition $$\frac{1-R_2}{1+R_2} = \frac{(LL - M_i)(ab)j\omega\mu_o}{2I_{yg}^2(1,0)\gamma_{10}};$$

(n) selecting a value of $\epsilon_i$ which is a member of both the first set and the second set of values corresponding to the calculated second variable $M_i$ and setting this selected value equal to a variable $\epsilon_d$;

(o) establishing a second set of estimated values for the real part of the dielectric constant associated with the substance of interest, $\epsilon_{ri}$, where i ranges between 1 and S, such that $\epsilon_{ri} = \epsilon_i - j\epsilon'$, where $\epsilon'$ is an imaginary part of the dielectric constant associated with the substance of interest, where $\epsilon_{r1} = \epsilon_d - X_1$ and $\epsilon_{rS} = \epsilon_d + x_1$ and $\epsilon' = x_2$, where $x_1$ is approximately equal to 0.5 and $x_2$ is a preselected value based on expected conductivity of the substance of interest;

(p) re-calculating the second variable $M_i$ for i ranging between 1 and S as $$M_i = \sum_{p=1}^{}\sum_{q=1}^{} C_{pq}\left(\frac{q\pi}{h}\right)\cos(\alpha_{pq}d)I_{yc}(p,q) +$$
$$\frac{1}{j\omega\mu_o}\sum_{p=1}^{}\sum_{q=1}^{} D_{pg}\alpha_{pq}\left(\frac{p\pi}{g}\right)\cos(\alpha_{pq}d)I_{yc}(p,q) +$$
$$\frac{1}{j\omega\mu_o}\sum_{p=1}^{} D_{p0}\alpha_{po}\left(\frac{p\pi}{g}\right)\cos(\alpha_{p0}d)I_{yc}(p,o),$$

where $$k_i = \omega\sqrt{\mu_0\epsilon_o(\varepsilon_{ri} - \varepsilon')}$$

and $$C_{pq} = -\left(\frac{\frac{q\pi}{h}}{\frac{p\pi}{g}}\right)\left(\frac{(j\omega\varepsilon_o\varepsilon_{ri} + \delta)}{\alpha_{pq}}\right)D_{pq};$$

(q) establishing a first set of values of $\epsilon_{ri}$ corresponding to the re-calculated second variable $M_i$ which satisfy the condition $$\frac{1-R_1}{1+R_1} = \frac{(LL - M_i)(ab)j\omega\mu_o}{2I_{yg}^2(1,0)\gamma_{10}};$$

(r) establishing a second set of values of $\epsilon_{ri}$ corresponding to the re-calculated second variable $M_i$ which satisfy the condition $$\frac{1-R_2}{1+R_2} = \frac{(LL - M_i)(ab)j\omega\mu_o}{2I_{yg}^2(1,0)\gamma_{10}};$$

(s) selecting a value of $\epsilon_{ri}$ which is a member of both the first set and the second set of values corresponding to the re-calculated second variable $M_i$ and setting the selected value equal to a variable $\epsilon_{rd}$; and (t) re-calculating the imaginary part of the dielectric constant associated with the substance of interest, $\epsilon'$, as $\epsilon' = j(\epsilon_{rd} - \epsilon_d)$, wherein the dielectric constant associated with the substance of interest is determined as $\epsilon_{rd} + j(\epsilon_{rd} - \epsilon_d)$.

2. An apparatus to measure a complex dielectric constant of a substance, comprising:

an open ended rectangular waveguide having a cross-sectional width a and a cross-sectional height b adapted to receive an electromagnetic wave through an open end thereof;

an electromagnetic wave generator for generating the electromagnetic wave;

a non-resonant rectangular cavity in communication with one of the ends of the open ended rectangular waveguide at an interface between the open ended rectangular waveguide and the non-resonant rectangular cavity, said non-resonant rectangular cavity having a cross-sectional width g, a cross-sectional height h and selectively adjustable a cross-sectional length d, said non-resonant rectangular cavity adapted to be symmetrically fed the electromagnetic wave by the open ended rectangular waveguide, the non-resonant rectangular cavity adapted to be filled with a substance of interest;

a network analyzer; and a system to determine the complex dielectric constant of the substance of interest, the system including a processor and a memory, the processor executing instructions of a program stored in the memory to implement the determination of the complex dielectric constant, the program directing the processor to perform the following:

(a) calculate a first variable LL as $$LL = \sum_{m=1}\sum_{n=1} B_{mn}\left(\frac{n\pi}{b}\right)I_{yg}(m,n) - $$

$$\frac{1}{j\omega\mu_o}\sum_{m=1}\sum_{n=1} A_{mn}\gamma_{mn}\left(\frac{m\pi}{a}\right)I_{yg}(m,n) - \frac{1}{j\omega\mu_o}\sum_{m=2} A_{m0}\gamma_{mo}\left(\frac{m\pi}{a}\right)I_{yg}(m,o),$$

where in and n are summation indices ranging between 1 and N, where N is an integer selected for stabilization of the summations, $$A_{mn} = \frac{-m\pi/a}{k_{mn}^2}\left(\frac{4}{ab}\right)I_{yg}(m,n),$$

where $$k_{mn} = \sqrt{\left(\frac{m\pi}{a}\right)^2 + \left(\frac{n\pi}{b}\right)^2}$$

and $$I_{yg}(m,n) = \int_{x=0}^{a}\int_{y=0}^{b} f_y(x,y)\sin\left(\frac{m\pi x}{a}\right)\cos\left(\frac{n\pi y}{b}\right)dxdy,$$

where $$f_y(x,y) = \frac{\sin\left(\frac{\pi}{a}x\right)}{\sqrt{1-\left(\frac{y-\frac{b}{2}}{\frac{b}{2}}\right)^2}},$$

x and y being Cartesian coordinates corresponding to width and height, respectively, $$B_{mn} = -\left(\frac{\frac{n\pi}{b}}{\frac{m\pi}{a}}\right)\left(\frac{j\omega\epsilon_o}{\gamma_{mn}}\right)A_{mn},$$

where j is the imaginary number, $\omega$ is an angular frequency of the electromagnetic wave, $\epsilon_o$ is the constant permittivity of free space, and $$\gamma_{mn} = \sqrt{k_{mn}^2 - k_o^2},$$

where $$k_0 = \omega\sqrt{\mu_0\epsilon_o},$$

where $\mu_0$ is the constant magnetic permeability of free space, wherein $$A_{m0} = \frac{-2}{m\pi/a}\left(\frac{1}{ab}\right)I_{yg}(m,0)$$

for m≠1;

(b) establish a first set of estimated values for a real part of a dielectric constant associated with the substance of interest, $\epsilon_i$, where i ranges between 1 and a pre-selected integer S;

(c) calculate a second variable $M_i$ for i ranging between 1 and S as $$M_i = \sum_{p=1}\sum_{q=1} C_{pq}\left(\frac{q\pi}{h}\right)\cos(\alpha_{pq}d)I_{yc}(p,q) + $$

$$\frac{1}{j\omega\mu_o}\sum_{p=1}\sum_{q=1} D_{pq}\alpha_{pq}\left(\frac{p\pi}{g}\right)\cos(\alpha_{pq}d)I_{yc}(p,q) + $$

$$\frac{1}{j\omega\mu_o}\sum_{p=1} D_{p0}\alpha_{po}\left(\frac{p\pi}{g}\right)\cos(\alpha_{p0}d)I_{yc}(p,o),$$

where p and g are summation indices ranging between 1 and N, $$D_{pq} = \frac{-p\pi/g}{k_{pq}^2 \sin(\alpha_{pq}d)}\left(\frac{4}{gh}\right)I_{yc}(p,q),$$

where $$k_{pq} = \sqrt{\left(\frac{p\pi}{g}\right)^2 + \left(\frac{q\pi}{h}\right)^2}$$

and $$\alpha_{pq} = \sqrt{k_i^2 - k_{pq}^2},$$

where $$k_i = \omega\sqrt{\mu_0 \epsilon_o \epsilon_i},$$

and $$C_{pq} = -\left(\frac{\frac{q\pi}{h}}{\frac{p\pi}{g}}\right)\left(\frac{(j\omega\epsilon_o\epsilon_i + \delta)}{\alpha_{pq}}\right)D_{pq},$$

where $$I_{yc}(p,q) = \int_{x=0}^{a}\int_{y=0}^{b} f_y(x,y)\sin\left(\frac{p\pi x}{g}\right)\cos\left(\frac{q\pi y}{h}\right)dx\,dy$$

and $$D_{p0} = \frac{-1}{\frac{p\pi}{g}\sin(\alpha_{p0}d)}\left(\frac{2}{gh}\right)I_{yc}(p,0);$$

(d) establish a first set of values of $\epsilon_i$ corresponding to the calculated second variable $M_i$ which satisfy the condition $$\frac{1-R_1}{1+R_1} = \frac{(LL-M_i)(ab)j\omega\mu_o}{2I_{yg}^2(1,0)\gamma_{10}},$$

where $R_1$ is a first reflection coefficient of a transmitted electromagnetic wave measured at the interface between the open ended rectangular waveguide and the non-resonant rectangular cavity at a first cross-sectional length d by the network analyzer;

(e) establish a second set of values of $\epsilon_i$ corresponding to the calculated second variable $M_i$ which satisfy the condition $$\frac{1-R_2}{1+R_2} = \frac{(LL-M_i)(ab)j\omega\mu_o}{2I_{yg}^2(1,0)\gamma_{10}},$$

where $R_2$ is a second reflection coefficient measured at the interface between the open ended rectangular waveguide and the non-resonant rectangular cavity at a second cross-sectional length d different from the first cross-sectional length d by the network analyzer;

(f) select a value of $\epsilon_i$ which is a member of both the first set and the second set of values corresponding to the calculated second variable $\epsilon_i$ and set this selected value equal to a variable $\epsilon_d$;

(g) establish a second set of estimated values for the real part of the dielectric constant associated with the substance of interest, $\epsilon_{ri}$, where i ranges between 1 and S, such that $\epsilon_{ri}=\epsilon_i-j\epsilon'$, where $\epsilon'$ is an imaginary part of the dielectric constant associated with the substance of interest, where $\epsilon_{r1}=\epsilon_d-x_1$ and $\epsilon_{rS}=\epsilon_d+x_1$ and $\epsilon'=x_2$, where $x_1$ is approximately equal to 0.5 and $x_2$ is a pre-selected value based on expected conductivity of the substance of interest;

(h) re-calculate the second variable $M_i$ for i ranging between 1 and S as $$M_i = \sum_{p=1}\sum_{q=1} C_{pq}\left(\frac{q\pi}{h}\right)\cos(\alpha_{pq}d)I_{yc}(p,q) +$$

$$\frac{1}{j\omega\mu_o}\sum_{p=1}\sum_{q=1} D_{pq}\alpha_{pq}\left(\frac{p\pi}{g}\right)\cos(\alpha_{pq}d)I_{yc}(p,q) +$$

$$\frac{1}{j\omega\mu_o}\sum_{p=1} D_{p0}\alpha_{po}\left(\frac{p\pi}{g}\right)\cos(\alpha_{p0}d)I_{yc}(p,o),$$

where $$k_i = \omega\sqrt{\mu_0\epsilon_o(\epsilon_{ri}-\epsilon')}$$

and $$C_{pq} = -\left(\frac{\frac{q\pi}{h}}{\frac{p\pi}{g}}\right)\left(\frac{(j\omega\epsilon_o\epsilon_{ri}+\delta)}{\alpha_{pq}}\right)D_{pq};$$

(i) establish a first set of values of $\epsilon_{ri}$ corresponding to the re-calculated second variable $M_i$ which satisfy the condition $$\frac{1-R_1}{1+R_1} = \frac{(LL-M_i)(ab)j\omega\mu_o}{2I_{yg}^2(1,0)\gamma_{10}},$$

(j) establish a second set of values of $\epsilon_{ri}$ corresponding to the re-calculated second variable $M_i$ which satisfy the condition $$\frac{1-R_2}{1+R_2} = \frac{(LL-M_i)(ab)j\omega\mu_o}{2I_{yg}^2(1,0)\gamma_{10}},$$

(k) select a value of $\epsilon_{ri}$ which is a member of both the first set and the second set of values corresponding to the re-calculated second variable $M_i$ and setting the selected value equal to a variable $\epsilon_{rd}$; and (l) re-calculate the imaginary part of the dielectric constant associated with the substance of interest, $\epsilon'$, as $\epsilon'=j(\epsilon_{rd}-\epsilon_d)$, wherein the dielectric constant associated with the substance of interest is determined as $\epsilon_{rd}+j(\epsilon_{rd}-\epsilon_d)$.

* * * * *